US008271253B2

(12) United States Patent
Ward

(10) Patent No.: US 8,271,253 B2
(45) Date of Patent: Sep. 18, 2012

(54) SYMBOLIC DEPTH-FIRST SEARCHES USING CONTROL FLOW INFORMATION FOR IMPROVED REACHABILITY ANALYSIS

(75) Inventor: David Ward, Broomfield, CO (US)

(73) Assignee: International Business Machines Corporation, Armonk, NY (US)

( * ) Notice: Subject to any disclaimer, the term of this patent is extended or adjusted under 35 U.S.C. 154(b) by 1262 days.

(21) Appl. No.: 11/687,427

(22) Filed: Mar. 16, 2007

(65) Prior Publication Data
US 2008/0228679 A1    Sep. 18, 2008

(51) Int. Cl.
    *G06F 17/50*    (2006.01)
(52) U.S. Cl. ............ 703/14; 703/17; 716/107; 716/106; 716/104; 717/124; 717/132; 717/104
(58) Field of Classification Search .................. 703/14; 714/38, 731; 717/135, 124
    See application file for complete search history.

(56) References Cited

U.S. PATENT DOCUMENTS

| 7,281,225 | B2 * | 10/2007 | Jain et al. ........................ 716/5 |
| 7,584,455 | B2 * | 9/2009 | Ball ............................. 717/124 |
| 2004/0148150 | A1 * | 7/2004 | Ashar et al. .................... 703/14 |
| 2005/0086648 | A1 * | 4/2005 | Andrews et al. .............. 717/135 |
| 2005/0229044 | A1 * | 10/2005 | Ball ................................. 714/38 |
| 2006/0047680 | A1 * | 3/2006 | Paruthi et al. ................. 707/102 |
| 2006/0150043 | A1 * | 7/2006 | Sarwary et al. ............... 714/731 |

OTHER PUBLICATIONS

Fabio Somenzi, David Ward Automatic Generation of Hints for Symbolic Traversal Charme 2005, LNCS 3725, pp. 207-221, 2005.*
David Currie A Tool for Formal Verification of DSP Assembly Language Programs A Thesis submitted in partial fulfillment of the requirements for the degree of M.S., University of British Columbia, Aug. 1999.*
D. Ward, et al., "Decomposing Image Computation for Symbolic Reachability Analysis Using Control Flow Information", ACM 2006, ICCAD Nov. 5-9, 2006, San Jose CA, pp. 779-785.

* cited by examiner

*Primary Examiner* — Saif Alhija
*Assistant Examiner* — Cuong Luu
(74) *Attorney, Agent, or Firm* — Rabindranath Dutta; Konrad Raynes and Victor LLP

(57) ABSTRACT

Methods are provided for performing depth-first searches of concrete models of systems using control flow information of the system for improved reachability analysis. The concrete model's control structure and dependencies are extracted and an over-approximated (conservative) abstract control model is created. The abstract control model simulates the concrete model during model checking. Model checking the abstract control model produces execution traces based on the control paths of the concrete model. These execution traces may be used to guide a state space search on the concrete model during invariant checking to determine satisability of one or more selected invariants of the system.

6 Claims, 6 Drawing Sheets

FIG. 1

```
MODULE EXAMPLE(CLOCK, RST, INDAT);
     INPUT              CLOCK;
     INPUT[31:0]        INDAT;
     INPUT              RST;
     INPUT              STATE;
     REG[31:0]          A, B, C

INITIAL BEGIN
     A=0; B=0; C=0;

ALWAYS @ (POSEDGE CLOCK) BEGIN
P1:       IF(RST) BEGIN
S1...S3:       A=0; B=0; C=0;
          END
P2:       IF(!STATE) BEGIN
P3:            IF( C == 0)
S4:                 A = INDAT;
               ELSE
P4:                 IF (STATE)
S5:            END ELSE BEGIN
P5:                 IF (C < 4095)
S6:                      C = C + 1;
               END
          END
ENDMODULE
```

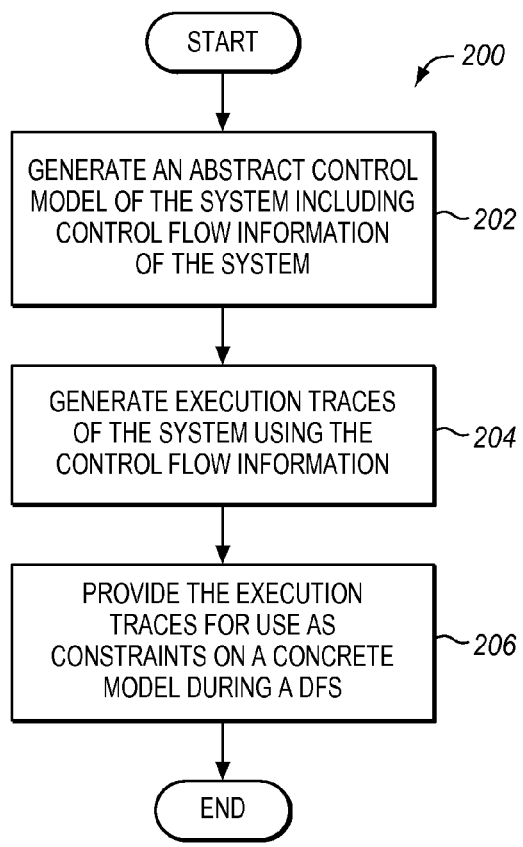

FIG. 2

START → GENERATE AN ABSTRACT CONTROL MODEL OF THE SYSTEM INCLUDING CONTROL FLOW INFORMATION OF THE SYSTEM (202) → GENERATE EXECUTION TRACES OF THE SYSTEM USING THE CONTROL FLOW INFORMATION (204) → PROVIDE THE EXECUTION TRACES FOR USE AS CONSTRAINTS ON A CONCRETE MODEL DURING A DFS (206) → END

| CFG PATH | PATH PREDICATE | PATH DEFINES |
|---|---|---|
| 1 | RST ∧ ¬ STATE ∧ C = 0 | A, B, C |
| 2 | RST ∧ ¬ STATE ∧ ¬ (C = 0) | A, B, C |
| 3 | RST ∧ STATE ∧ C < 4095 | A, B, C |
| 4 | RST ∧ STATE ∧ C ≥ 4095 | A, B, C |
| 5 | ¬ RST ∧ ¬STATE ∧ C = 0 | A, B, C |
| 6 | ¬ RST ∧ ¬ STATE ∧ ¬ (C = 0) | ∅ |
| 7 | ¬ RST ∧ STATE ∧ C ≥ 4095 | ∅ |
| 8 | ¬ RST ∧ STATE ∧ C < 4095 | C |

```
MODULE EXAMPLE(CLOCK, RST, INDAT);    500
    INPUT           CLOCK;
    INPUT[31:0]     INDAT;
    INPUT           RST;
    INPUT           STATE;
    REG[31:0]       C

INITIAL BEGIN
    C=0;

ALWAYS @ (POSEDGE CLOCK) BEGIN
        IF(RST)
            C=0;
        IF(STATE)
            IF ( C < 4095)
                C = C + 1;
        END
ENDMODULE
```

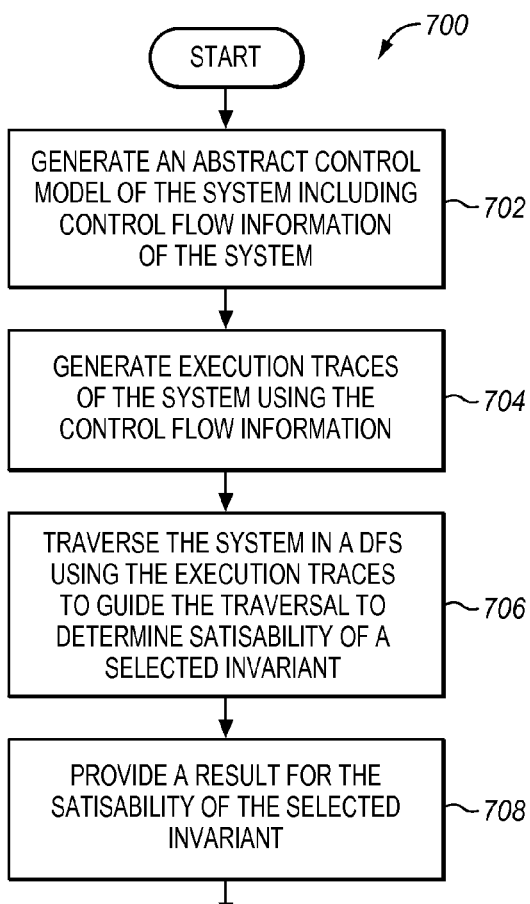
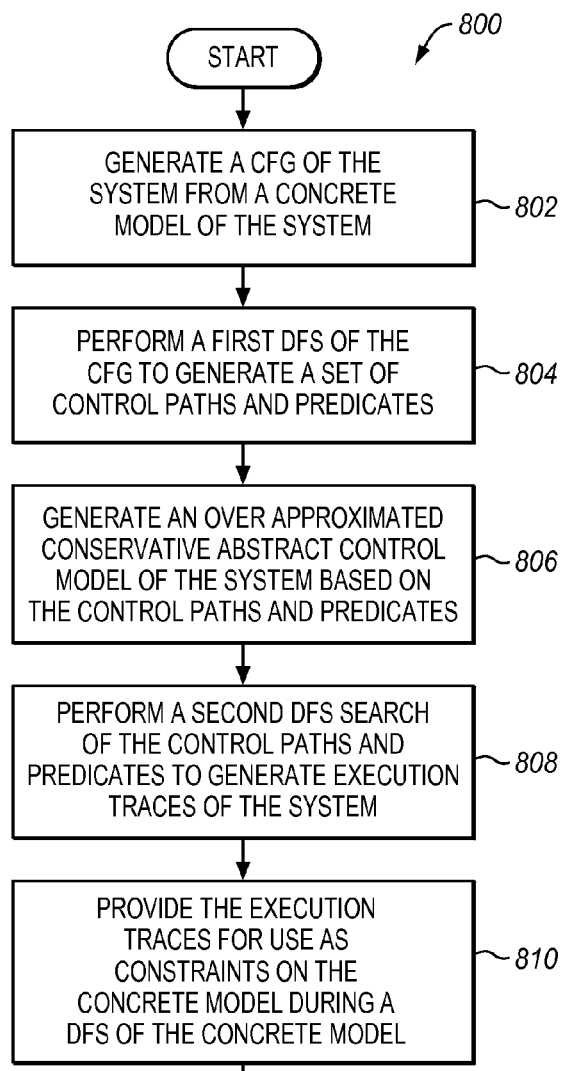
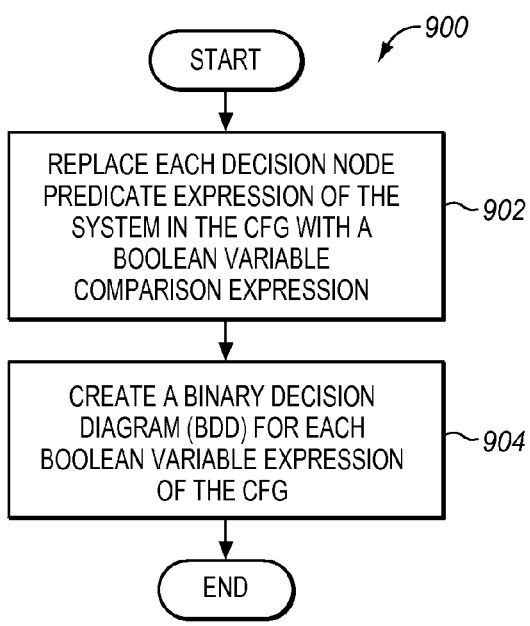

SYMBOLIC DEPTH-FIRST SEARCHES USING CONTROL FLOW INFORMATION FOR IMPROVED REACHABILITY ANALYSIS

BACKGROUND OF THE INVENTION

1. Field of the Invention

The invention is related to the field of program analysis, and in particular, to using control flow information for performing a symbolic depth-first search of a system to perform reachability analysis and verification of the system.

2. Statement of the Problem

The design of integrated circuit devices conventionally uses hardware description languages (HDLs) to describe circuits (herein also called "systems") at various levels of abstraction. As a circuit design evolves, designers and verification engineers conduct analysis of the circuit or device being designed to evaluate the quality of the design and to find and eliminate any inadequacies potentially leading to future problems such as impossibility or inaccuracy in performance of the system.

Invariant checking is a popular form of verifying the operation of a system, as well as for verifying the operation of software applications or program code. As used herein, system refers to software applications or program code, as well as any type of circuit expressed in a HDL or any other type of programmatic representation of the circuit. In invariant checking, a propositional formula expresses a property that should hold in all reachable states of the system. For example, an arbitration protocol should satisfy the mutual exclusion property, which states that two requesters should not be granted simultaneous access to a shared resource. If two requesters are able to simultaneously access the same resource, then the invariant fails, and the system does not function properly.

Systems modeled as Finite State Machines (FSMs) may exploit symbolic computations based on Binary Decision Diagrams (BDDs). A BDD is a data structure that represents a Boolean function. Several approaches are in use for the formal verification of invariants. Model checking is one such approach, because model checking is largely automated and produces counterexamples if the invariant does not hold. One approach to model checking is based on the computation of fixed points and typically uses BDDs for the representation of sets of states. The other approach is based on the search for a path to a state violating the property.

Using BDDs, states may be represented implicitly and explicitly. The typical BDD-based invariant-checking algorithm performs a breadth-first search (BFS) of the state space from the initial states. All states at distance k from the initial states are acquired by the k-th image computation, without explicit enumeration of either states or transitions. Whenever the BDDs that symbolically represent states and transition relations remain compact, BFS is very efficient. However, a constraint that is imposed on the order in which states are visited (i.e., distance from the initial states) often leads to sets whose representation is not compact. In addition, the requirement to compute all the states at a certain distance at once often leads to very large BDDs at the intermediate steps of some image computations.

If the set of states cannot be represented compactly, then the BFS approach runs into a state explosion problem or time limit to provide an answer to the property in question. The state explosion problem occurs when an input to the design, intended to permit analysis of the response of the system to a particular input, generates such a large number of possible output or intermediate states as to overrun any memory used in supporting the analysis. In order for model checkers to be used to find bugs and errors in software systems, the model checkers must find ways around the state explosion problem. Thus, improved solutions are needed for automated model checking of systems.

SUMMARY OF THE SOLUTION

The invention solves the above and other problems with methods for implementing a symbolic depth first search (DFS) using control flow information for improved reachability analysis. A symbolic DFS strategy based on the control structure of a system is used to traverse a concrete model of the system. Using a DFS attempts to avoid the state explosion problem by working with smaller sets of states produced by partitioning the sets of states by one of the active control paths. The set of states are constrained by a single control path at each search depth. By contrast, a BFS strategy finds all successors of a state at once. The DFS search strategy is repeated until a fixed point is reached (e.g., all reachable states discovered) or an error state is detected. Advantageously, the DFS search reduces the computation complexity and memory requirements needed for the verification of the system.

A first exemplary embodiment of the invention comprises a method for performing invariant checking of a system. The method comprises generating an abstract control model of the system from a concrete model of the system. The abstract control model of the system includes control flow information regarding the system. The method further comprises generating execution traces of the system using the control flow information of the abstract control model. The method further comprises providing the execution traces for use as constraints on the concrete model during a DFS to determine satisability of a selected invariant of the system.

A second exemplary embodiment of the invention comprises a method for performing invariant checking of a system. The method comprises generating an abstract control model of the system from a concrete model of the system. The method further comprises generating a set of execution traces of the abstract control model using the control flow information. The method further comprises traversing the system in a DFS using the set of execution traces to guide the traversal of the system to determine satisability of a selected invariant of the system. The traversal of the system generates a result for the satisability of the selected invariant. The method further comprises providing the result for the satisability of the selected invariant.

A third exemplary embodiment of the invention comprises a method for performing invariant checking of a system. The method comprises generating a control flow graph (CFG) of the system from a concrete model of the system. The method further comprises performing a first DFS of the CFG to generate a set of control paths and predicates. The method further comprises generating an over approximated conservative abstract control model of the system based on the control paths and predicates. The method further comprises performing a second DFS search of the control paths and predicates to generate execution traces of the system. The method further comprises providing the execution traces for use as constraints on the concrete model during a DFS to determine satisability of a selected invariant of the system.

A fourth exemplary embodiment of the invention comprises a method for performing invariant checking of a system. The method comprises generating a CFG of the system from a concrete model of the system. The method further comprises performing a first DFS of the CFG to generate a set of control paths and predicates. The method further comprises generating an over approximated conservative abstract control model of the system based on the control paths and predicates. The method further comprises performing a second DFS search of the control paths and predicates to generate execution traces of the system. The method further comprises traversing the system in a third DFS using the set of execution traces to guide the traversal of the system to determine satisability of a selected invariant. The traversal of the system generates a result for the satisability of the selected invariant. The method further comprises providing the result for the satisability of the selected invariant.

A fifth exemplary embodiment of the invention comprises a method for performing invariant checking of a system to determine satisability of a selected invariant. The method comprises generating a CFG of the system. The method further comprises performing a first DFS of the CFG to generate a set of control paths and predicates. The method further comprises generating an over approximated conservative abstract control model of the system based on the control paths and predicates. The method further comprises determining whether the selected invariant includes only control variables of the system. In response to a determination that the selected invariant includes only control variables of the system, a second DFS of the abstract control model is performed to determine satisability of the selected invariant to generate a result for the selected invariant. Further in response to a determination that the selected invariant includes only control variables of the system, a third DFS search of the control paths and predicates is performed to generate execution traces of the system. In response to a determination that the selected invariant does not only include control variables of the system, the method further comprises traversing the system in a fourth DFS using the set of execution traces to guide the traversal of the system to determine satisability of the selected invariant to generate a result for the satisability of the selected invariant. The method further comprises providing the result for the satisability of the selected invariant.

The invention may include other exemplary embodiments described below.

DESCRIPTION OF THE DRAWINGS

The same reference number represents the same element or similar type of element on all drawings.

FIG. 1 illustrates an example program written in Verilog which is used to illustrate aspects of the exemplary embodiments of the invention.

FIG. 2 illustrates a method for performing invariant checking of a system in an exemplary embodiment of the invention.

FIG. 7 illustrates a flow chart of a method for traversing a system using execution traces as constraints on the system to determine satisability of a selected invariant in an exemplary embodiment of the invention.

FIG. 8 illustrates a method for performing invariant checking of a system in another exemplary embodiment of the invention.

FIG. 9 illustrates a method for performing invariant checking of a system in another exemplary embodiment of the invention.

DETAILED DESCRIPTION OF THE INVENTION

Figures 3, 4:
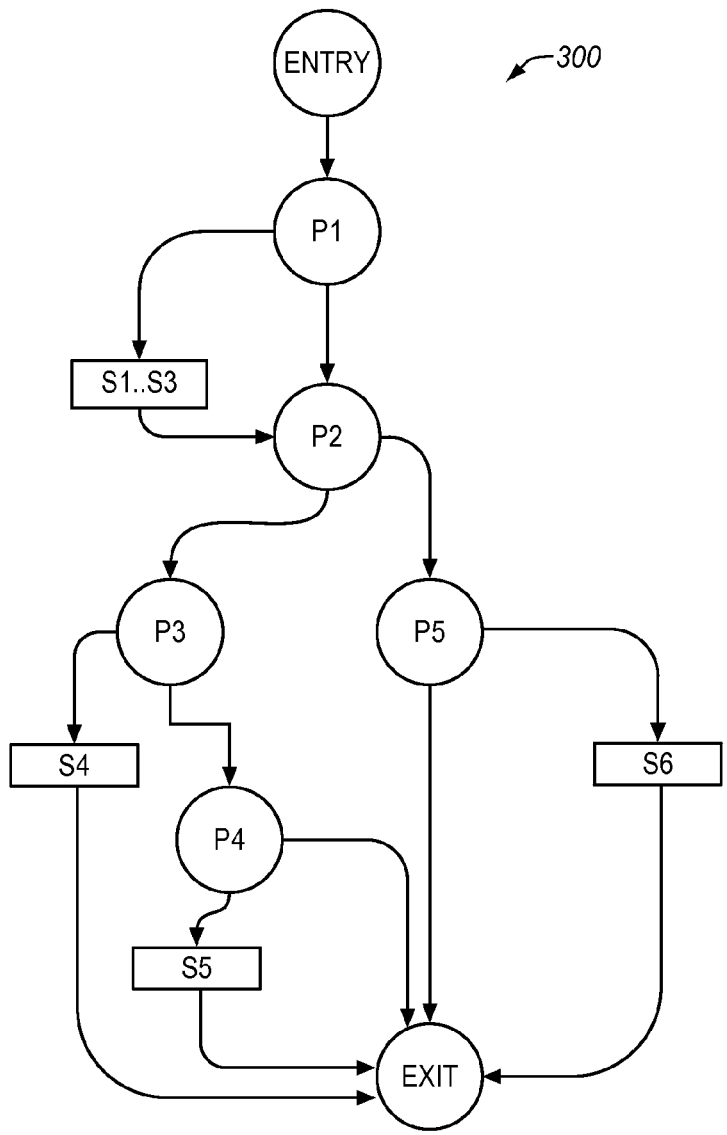
FIG. 3 illustrates a CFG of the example program of FIG. 1.
FIG. 4 illustrates a control flow analysis of the example program of FIG. 1 and the CFG of FIG. 3.

FIGS. 1-12 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Consider symbolic reachability analysis of transition systems with finite sets of states Q and inputs W defined by a transition relation $T \subset Q \times W \times Q$ and an initial state set $I \subset Q$. A triple $(q_1, w, q_2)$ is in $T$ if and only if the transition system can proceed from $q_1$ to $q_2$ when the input is w. In this case $q_2$ is a successor of $q_1$. State q is reachable from state $q_0$ if there exists a sequence of states $q_1 \ldots q_n$ such that $q=q_1$, $q_0=q_n$, and for $1<i\leq n$, $q_i+1$ is a successor of $q_i$. The reachability analysis problem consists of finding all states that are reachable from some state in I. For $S \subset Q$, let E Y S denote all states that are successors of some state in S. Then reachability can be computed as a fixed point $\mu Z. I \cup E Y Z$.

Let $Z_0=I$ and, for $i \geq 0$, $Z_i+1=I \cup E Y Z_i$ be the iterates of the computation. Then $Z_i$ contains the states that can be reached in at most i steps from states in I. Hence, the fixed point computation corresponds to a BFS of the transition system starting from the initial states. In symbolic model checking, transition relations and sets of states are represented by their characteristic functions, which can be manipulated in various forms. In this application reduced or ordered BDDs are used for this purpose. Success with symbolic computations depends on an algorithm's ability to keep the BDDs small. Several factors affect the size of BDDs, including the variable orders. An assumption is made that the transition relation T is complete, that is, $\forall q_1 \in Q$. $\forall w \in W$. $\exists q_2 \in Q$. $(q_1, w, q_2) \in T$, and that it is represented by a predicate $T(x, w, y)$, where x is a vector of current state variables, w is a vector of primary inputs, and y is a vector of next state variables. All variables are binary. Without a loss of generality, a binary encoding for the states and the inputs may be assumed, so that the x and y variables range over the encoding of the states and the w variables range over the encodings of the inputs. States and inputs are not distinguished from their encodings. $T(x, w, y)$ is true when the valuations of x, w, and y correspond to a transition in T. The transition relation predicate is often represented in a conjunctively decomposed form:

$$T(x, w, y) = \bigwedge_i T_i(y^i, w, x),$$

where each $T_i$ defines a subvector $y_i$ of the next state variables such that $\{y_i\}$ is a partition of y. Image computation with a conjunctively partitioned transition relation consists of evaluating $$Z_{i+1}(y) = \exists\, x,\, w.\, \bigwedge_i T_i(y^i, w, x) \wedge Z_i(x),$$

where quantification of variable vectors is shorthand for the quantification of all the variables in the vector, $\exists x.f = \exists x_1 \exists x_2 \ldots, f$, and $Z_i(x)$ is the characteristic function of the states whose successors are sought. For the result $Z_i+i(y)$ to be employed in the next image computation, it must be converted to $Z_i+i(x)$ by variable substitution. Variables are in practice quantified as soon as possible, as this normally helps in keeping the BDDs sizes under control. A variable can be quantified as soon as it appears only in one conjunct. Current BDD packages provide operations that quantify variables while conjoining two BDDs. Knowing what variables are defined along each path of the control flow graph allows a more effective quantification schedule.

FIG. 1 illustrates an example program 100 written in Verilog which will be used to illustrate aspects of the exemplary embodiments of the invention. Program 100 is split into numbered lines, which are prefixed with "S" for statements and "P" for predicates (i.e., conditional statements). Predicates are decisions based on the value of one or more decision variables, which control the flow to the statements. Program 100 includes five predicates; numbered P1-P5, and six statements, numbered S1-S6. Program 100 also includes definitions of variables and initial values of variables a, b and c, which are not numbered in the described example.

FIG. 2 illustrates a method 200 for performing invariant checking of a system in an exemplary embodiment of the invention. Invariants should hold globally for every clock cycle of the system. Method 200 generates a set of execution traces which may be used as constraints on a system during invariant checking of the system. The steps of method 200 are not all-inclusive, and may include other steps not shown for the sake of brevity.

In step 202, an abstract control model of the system is generated from a concrete model of the system (i.e., the original representation of the system). The abstract control model of the system includes control flow information regarding the system. An abstract control model is a theoretical construct that presents the system under test with a set of variables and a set of logical and quantitative relationships between the abstract control model and the system. The abstract control model allows for a simulation of the system to illustrate the behavior of the system, and to prove or disprove one or more selected invariants (i.e., determine satisability of the selected invariant).

Given a concrete model in a register-transfer language (e.g., Verilog), a control-flow graph (CFG) may be built which captures information about the control structure of the concrete model (e.g., control predicates and paths). The control structure information can be used to dissect the concrete model into data and control parts (i.e., control and data abstract control models).

Control Flow Analysis

A CFG can be extracted in a single-pass traversal over the concrete model. To minimize the number of nodes of the CFG, statement nodes may be grouped and represented by a single node (e.g., a basic block). The requirement for grouping statement nodes depends on whether the execution of a set of statements depend on the same control predicate. For example, in example program 100, execution of statements S1-S3 depend on the same predicate P1. Therefore, statements S1-S3 may be grouped into a single node. The set of control predicates is simple to devise from the CFG. However, the control path generation is more complex. The complexity is determined by the desired accuracy of the abstract control model. To generate a set of feasible paths requires full reachability analysis to be performed on the abstract control model. This may be intractable for complex designs. A less complex approach is to perform static analysis on the concrete model—a DFS traversal over the CFG. This allows for dynamic accuracy tradeoffs to occur during static analysis and possibility during model checking. For example, a nested control depth limit can be imposed on the concrete model to reduce the number of paths or when the number of paths exceeds a maximum number. A simple transformation of the CFG for efficient control path generation is as follows:

Replace each decision node predicate expression with a Boolean variable comparison expression (e.g., $((a \leq b) \| c) \rightarrow (d=1)$, where $d = ((a \leq b) \| c)$) is a Boolean variable.

Create a BDD for each Boolean variable expression

Perform a DFS over the CFG

BDDs are a graphical representation of Boolean functions. A BDD is derived from a binary decision tree by merging isomorphic subgraphs and eliminating redundant nodes. For a given variable order, this derivation results in a canonical representation. As a consequence, equivalence tests are efficient, and due to memorization (i.e., storing the results of a function for later use), the algorithms that operate on BDDs are fast. Large sets can be manipulated via their characteristic functions, which in turn can be represented by BDDs. BDDs are used to represent sets of states and transitions in symbolic model checking.

By replacing each decision node predicate expression with a Boolean variable comparison expression, an efficient CFG of the system can be generated with BDDs representing each decision predicate expression. FIG. 3 illustrates a CFG 300 of example program 100 of FIG. 1. Each node of CFG 300 corresponds to a line from program 100. The nodes in CFG 300 are joined by arcs which define the flow through the nodes and correspond to the logic of program 100. In a CFG, a node can represent a plurality of statements, such as all of the statements between two conditional statements. For example, in CFG 300, a single node represents statements S1-S3, which correspond to the statements between predicates P1 and P2.

FIG. 4 illustrates a control flow analysis 400 of program 100 of FIG. 1 and CFG 300 of FIG. 3. Control flow analysis 400 illustrates the paths of CFG 300 and for each path displays the control predicate, and classifies the state variables modified by the statements as defined variables. There are a total of eight paths in CFG 300, and variables are defined and/or modified in six of the eight paths. For example, CFG path 1 in control flow analysis 400 corresponds to the path between entry and exit which flows through predicates P1, P2, and P3. In the execution of CFG path 1, statements S1-S3 and S4 are executed as a result of the decisions of predicates P1, P2 and P3.

All forms of abstraction may introduce unrealistic behaviors (e.g., behaviors not found in the concrete model) into the abstract control model. Error traces from model checking of the abstract control model are often used to rule out unrealistic behaviors (e.g., Counter-Example Guided Abstract Refinement). However, excessive abstraction may introduce additional behaviors which result in state-space blowup when attempting model checking using the abstract control model.

Therefore, an abstract control model is sought which preserves all the behaviors in the concrete model while minimizing the extraneous behaviors. This abstraction should produce an order of magnitude smaller state space than that of the concrete model from which it was derived. It is also desirable to have the abstract control model be a conservative approximation of the concrete model with respect to the control structure so that the abstract control model accurately simulates the concrete model. A loss of precision of data computations introduced by the abstraction may be chosen to give the ability to conduct control space reachability analysis.

Control Paths

An exemplary algorithm was discussed above for generating control paths of a system. However, in some cases, the number of paths over the CFG is exponential in regard to the size of the graph. This may occur for many different reasons. One particular reason is the occurrence of multiple "Always" blocks in a system. Thus, a mitigation strategy may be needed to reduce the number of control paths while ensuring a disjunctive partitioning of the model.

Multiple "Always" block control path generation suffers from having to take the Cartesian product of the paths produced by each "Always" block. This problem can be eliminated by determining the set of control paths on-the-fly instead of statically. Typically, the set of control paths are expected to be determined at compile time. Instead, the control structure is retrieved statically and the set of control paths are determined on request. Thus, only control path predicates enabled by the frontier set for each "Always" block may be used to determine the set of control paths. If the number of control paths exceeds the maximum allowed number of control paths, then a non-disjunctive partitioning image computation of the system may be used.

A second approach available to reduce the number of control paths is to halt the CFG analysis when a nesting depth limit is reached for an "Always" block and to disable control flow analysis on the functions. This ensures that the set of control paths partition the model paths disjunctively and fall within the range of $1 \leq paths \leq Max$.

Abstract Control Model

The techniques outlined above to reduce the number of paths is enabled (even if the maximum number of paths is not reached) when the abstract control model is equivalent to the concrete model. An abstract control model of the system is created which preserves the behaviors of the concrete model through the following steps:

Build a FSM using the latches or state variables in the support of the set of control predicates.

Existentially quantify latch variables not in the support of the control predicates from the abstract control model.

Figures 5, 6:
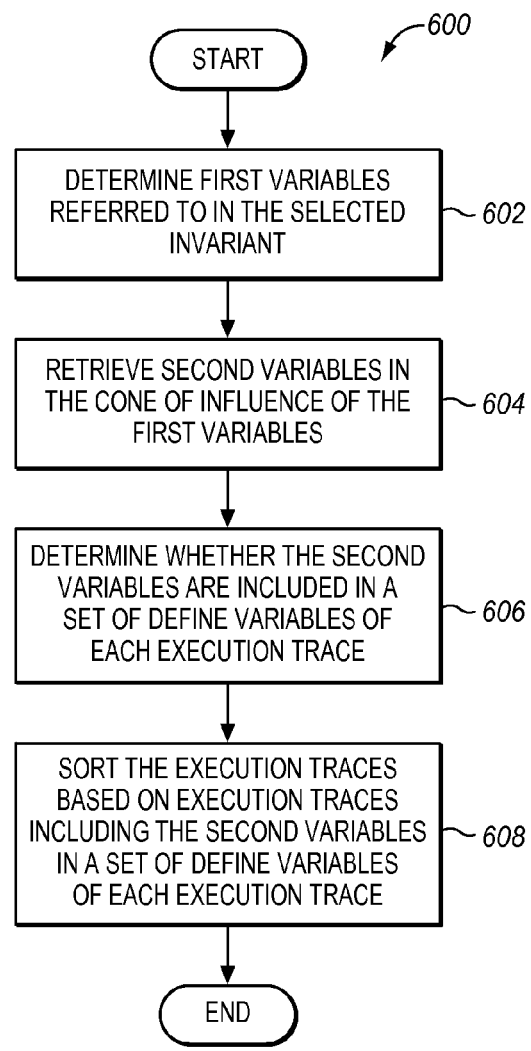
FIG. 5 illustrates an abstract control model of the example program of FIG. 1.
FIG. 6 illustrates a method for sorting execution traces based on a cone of influence in an exemplary embodiment of the invention.

The abstract control model 500 of example program 100 of FIG. 1 is illustrated in FIG. 5. In step 204, a set of execution traces of example program 100 are generated using the control flow information of abstract control model 500. An execution trace is a sequence of possible consecutive states of the execution of the program. A DFS traversal over the control predicates is used to find sequences which simulate the control-flow sequence of the concrete model. An execution trace is a sequence of hints for each step of the state space traversal. Each execution trace starts at the initial states and is unwound consecutively until a fixed point is reached. The execution traces are found on the abstract control model and may be replayed on the concrete model (i.e., the system) by constraining the transition relationship by the execution traces' path predicates. If a contradiction to the invariant is not discovered using the set of execution traces, then a BFS reachability analysis starting with the aggregated execution run reachable states is performed until a contradiction is found or a fixed point is reached.

In step 206, the execution traces are provided as constraints on the system during a DFS for verification of the system. The DFS of the system may be used to determine satisability (e.g., prove or disprove) a selected invariant. Providing the execution traces may include displaying the execution traces on a screen or suitable display device, printing the execution traces on a printer or other suitable printing device, storing the execution traces for later retrieval or use, or providing the execution traces to another application, circuit or device for use in a DFS traversal of the concrete model of the system.

Execution traces may be sorted based on their likelihood to lead to a contradiction (i.e., disproving the selected invariant). This may be done by an "invariant cone of influence contained-within-execution trace" check. FIG. 6 illustrates a method 600 for sorting execution traces based on a cone of influence in another exemplary embodiment of the invention. The steps of method 600 are not all-inclusive, and may include other steps not shown for the sake of brevity.

In step 602, variables referred to in the selected invariant are determined. For example, the selected invariant may refer to variable a. In step 604, variables within the cone of influence of the variables referred to in the selected invariant are retrieved. A variable is within the cone of influence of another variable if the variable depends on the other variable. For example, if the variable referred to in the invariant is a, and a statement within the program is b=a, then b is within the cone of influence of a.

In step 606, the execution traces are checked to determine whether the retrieved variables are contained within the set of define variables for the execution traces. Assume that the retrieved variable within the cone of influence of variable a is the variable b. Referring to control flow analysis 400 of FIG. 4, CFG paths 1-5 and 8 contain a defined variable included within the cone of influence of variable a. Thus, these CFG paths are more likely to lead to a contradiction of the invariant since they include a defined variable within the cone of influence of a variable referred to in the invariant.

In step 608, the execution traces are sorted based on whether the execution traces include a variable within the cone of influence of a variable referred to in the invariant. For example, the execution traces described in control flow analysis 400 (e.g., the CFG paths) may be sorted in the order 1, 2, 3, 4, 5, 8, 6, 7 for execution in the sorted order. The sorted order of the execution traces is more likely to lead to an earlier detection of a contradiction since execution traces including the variables within the cone of influence of the variables referred to in the invariant are executed first during a playback on the concrete model (i.e., the system).

Once a set of execution traces are generated, the execution traces may be played back (e.g., executed) on the original system. FIG. 7 illustrates a flow chart of method 700 for traversing a system using execution traces as constraints on the system to determine satisability of a selected invariant. Method 700 is not all-inclusive, and may include other steps not shown for the sake of brevity of the discussion.

In step 702, an abstract control model of the system (i.e., the concrete model) is generated. The abstract control model of the system includes control flow information regarding the system, and is generated as described above in method 200. In step 704, a set of execution traces of the system are generated using the control flow information. In step 706, a DFS traversal of the system (i.e., the concrete model) is performed using the execution traces to constrain the system and guide the DFS. Each execution trace is replayed (i.e., executed)

starting from the initial states. The transition relation is constrained by the execution trace hint for the depth reached and is repeated while there are states still unexplored. The cardinality of the execution traces may be smaller than the actual traversal depth, so the sequence is allowed to repeat from any point in the run, which is determined at the creation of the execution trace. From the traversal of the concrete model, the satisability of one or more selected invariants may be determined. A result of the satisability of the selected invariant is generated depending on whether the selected invariant is proved or disproved. In step 708, the result of the satisability for the selected invariant is provided to a user, application or computing device. Providing the result may include displaying the result on a screen or suitable display device, printing the result on a printer or other suitable printing device, storing the result for later retrieval or providing the result to another application, circuit or device.

FIG. 8 illustrates a method 800 for performing invariant checking of a system in another exemplary embodiment of the invention. Particularly, method 800 is directed at generating a set of execution traces which may be used as constraints on a concrete model of a system during invariant checking of the system. The steps of method 800 are not all-inclusive, and may include other steps not shown for the sake of brevity.

In step 802, a CFG of a system is generated from the concrete model of the system. In step 804, a DFS of the CFG is performed to generate a set of control paths and predicates. Illustrated below is exemplary pseudo code for implementing an exemplary algorithm for performing step 804.

```
CFG PATHS( ) {
    Paths = { };
    CFG PATH TRAVERSAL(entry,BDD ONE( ),Paths);
    return Paths;
};
CFG PATH TRAVERSAL(node, nodeBDD, Paths) {
    lvlBdd = nodeBDD;
    if (node == "exit") {
        Paths = Paths ∪ {nodeBdd};
        return;
    }
    foreach k ∈ OUT EDGES(node) {
        new node = EDGE DESTINATION NODE(k)
        if (NODE TYPE(newnode) == "decision") {
            if (EDGE PHASE(k) ≠ 0)
                newBDD = lvlBdd ∧ nodeBDD(node);
            else
                newBDD = lvlBdd ∧ ¬nodeBDD(node);
        } else {
            newBDD = lvlBdd;
        }
        if (newBDD ≠ 0)
            CFG PATH TRAVERSAL(new node,newBDD,Paths);
    }
    return;
}
```

In step 806, an over approximated conservative abstract control model of the system is generated based on the control paths and predicates. In step 808, a DFS search of the control paths and predicates is performed to generate execution traces of the system for use as constraints on the concrete model during a DFS of the concrete model to determine satisability of one or more selected invariants. Illustrated below is exemplary pseudo code for implementing an exemplary unsorted execution traces algorithm for performing step 808.

```
EXECUTION TRACES(Tabs) {
    Traces_{i≧1} = { };
    P = CFG PATHS( );
    TRACES TRAVERSAL(S_O,Tabs,P,Traces);
    return Traces;
}
```

In step 810, the execution traces are provided for use as constraints on the concrete model during a DFS of the concrete model.

FIG. 9 illustrates a method 900 for performing invariant checking of a system in another exemplary embodiment of the invention. Particularly, method 900 shows additional exemplary details of step 802 of method 800. Step 802 is directed generally at generating a CFG of a system from a concrete model of the system. The steps of method 900 are not all-inclusive, and may include other steps not shown for the sake of brevity.

The CFG will generally comprise decision node predicates corresponding to each predicate of the system. In step 902, each decision node predicate expression of the system is replaced with a Boolean variable comparison expression in the CFG. For example, the decision node $((a \leqq b)\|c)$ may be replaced with $(d=1)$, where $d=a \leqq b)\|c)$. In step 904, a BDD for each Boolean variable expression of the CFG is created. The BDDs may then be used in a DFS of the abstract control model to determine control paths of the system for generating execution traces of the system.

If a selected invariant contains only control variables (i.e., a variable found in the decision predicates of the system), then a DFS traversal of the system may not be needed.

Figure 10:
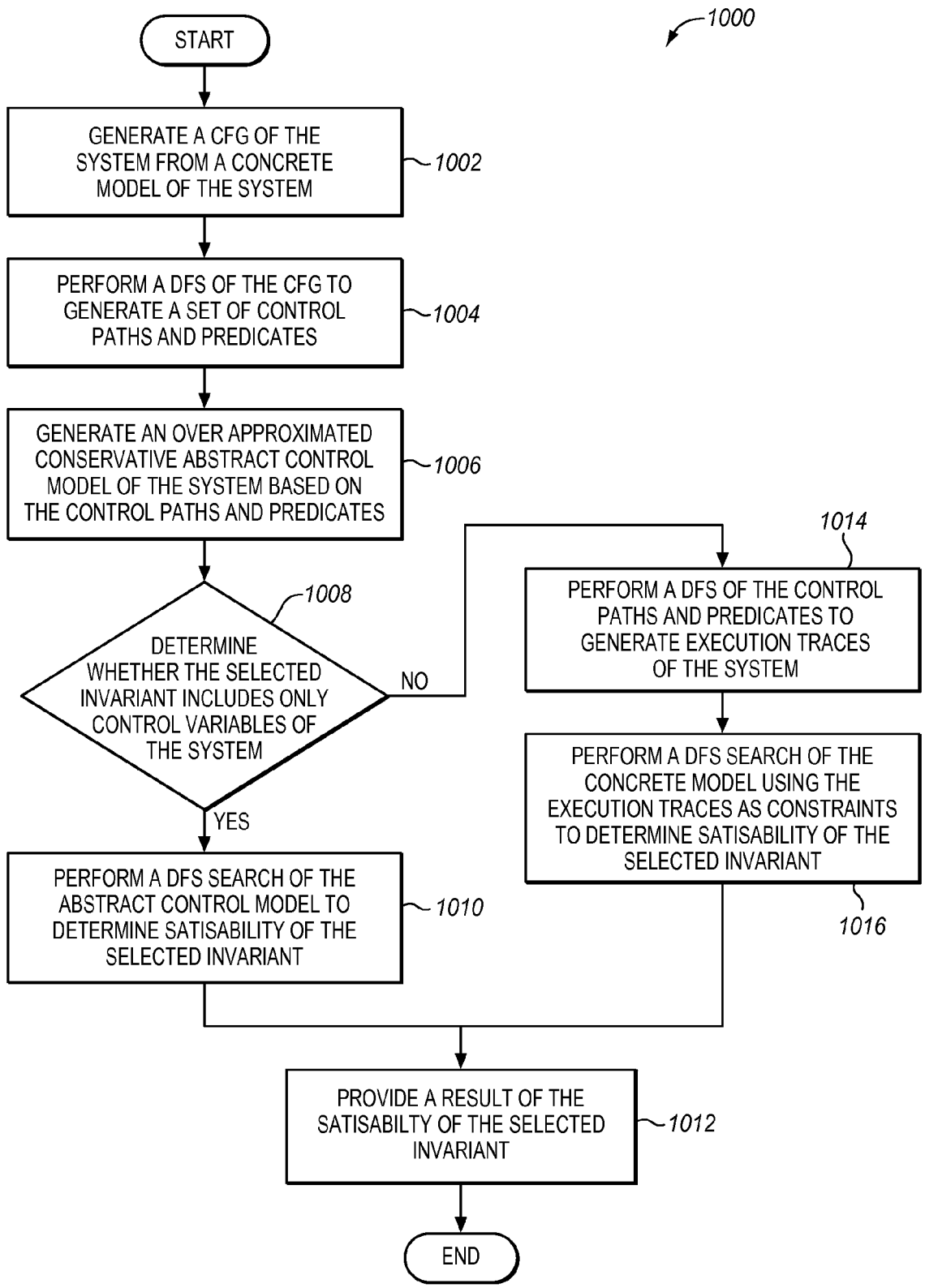
FIG. 10 illustrates a method for determining the satisability of a selected invariant in another exemplary embodiment of the invention.

Instead, a DFS may be performed on an abstract control model of the system to determine satisability of the selected invariant. This is a property of simulation (abstract control model $\succeq$ concrete model). FIG. 10 illustrates a method for determining the satisability of a selected invariant in another exemplary embodiment of the invention. The steps of method 1000 are not all-inclusive, and may include other steps not shown for the sake of brevity.

In step 1002, a CFG of the system is generated from a concrete model of the system. In step 1004, a DFS of the CFG is performed to generate a set of control paths and predicates. In step 1006, an over approximated conservative abstract control model of the system is generated based on the control paths and predicates.

In step 1008, the control paths and predicates are checked to determine whether the selected invariant includes only control variables of the system. If the selected invariant includes only control variables of the system, then processing continues in step 1010. If the selected invariant includes more variables than just control variables of the system, then processing continues in step 1014 to generate a set of execution traces of the system.

Performing Analysis on the Abstract Control Model

In step 1010, a DFS search of the abstract control model is performed to determine satisability of the selected invariant. If the selected invariant holds, then the generated result illustrates that the system functions correctly in regard to the selected invariant. If the selected invariant fails, then a counterexample to the selected invariant may be provided. Exemplary pseudo code for implementing step 1010 is provided below:

```
Reachability(S₀, CFG, T, OnionRing) {
    R = N = S₀;
    i = ||OnionRing||;
    while (N ≠ 0) {
        J = 0;
        foreach π ∈ PATHS(CFG) {
            N_π = N ∧ ∃ inputs .PATH COND(π);
            if (N_π ≠ 0) {
                T_π = T ∧ PATH COND(π);
                img = IMAGE(T_π, N_π);
                OnionRing_i = OnionRing_i ∪ {img};
                J = N ∨ img;
                i = i + 1;
            }
        }
        N = J ∧ ¬R;
        R = R ∨ N;
    }
    return R;
}
```

In step 1012, the result of the satisability of the selected invariant is provided to a user, another application or device, or stored for later use or retrieval.

Generating Execution Traces

In the case where the selected invariant includes variables which are not control variables, execution traces may be generated for guiding a DFS search of a concrete model of the system. In step 1014, a DFS traversal of the control paths and predicates is performed to generate execution traces of the system. In step 1016, a DFS of the concrete model is performed using the execution traces to guide the search to determine satisability of the selected invariant. Exemplary pseudo code for implementing step 1016 is provided below:

```
InvariantChecking(S₀, CFG, T, I, K) {
    OnionRing_{i≥1} = { };
    R = S₀;
    contradition=0;
    foreach ∈ K {
        R_k = N = S₀;
        j = 1;
        while (N ≠ 0) {
            T_π = T ∧ K_j mod ||k||;
            img = IMAGE(T_π, N);
            OnionRing_j = OnionRing_j ∪ {img};
            N = img ∧ ¬R_k;
            R_k = R_k ∨ N;
            j = j + 1;
            if (¬I ⊆ img) {
                contradition = 1;
                break;
            }
        }
        R = R ∨ R_k;
        if (contradition) {
            break;
        }
    }
    if (contradition == 0) {
        R = R ∨ Reachability(R, CFG, T, OnionRing);
    }
    return R;
}
```

In step 1012, a result of the satisability of the selected invariant is provided to a user, another application or device, or stored for later use or retrieval.

Figure 11:
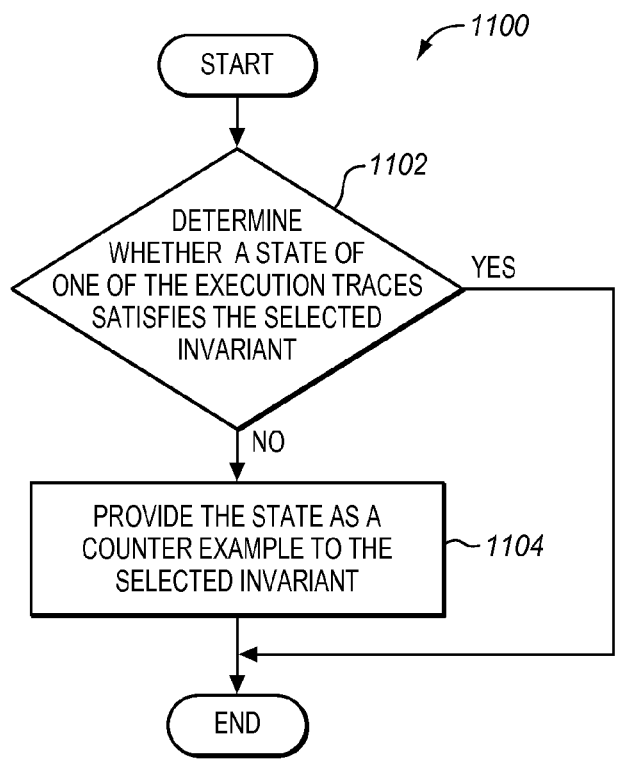
FIG. 11 illustrates a method for performing invariant checking of a system in another exemplary embodiment of the invention.

When a selected invariant is not satisfied the bad state may be provided as a counterexample for the selected invariant. FIG. 11 illustrates a method 1100 for performing invariant checking of a system in another exemplary embodiment of the invention. Particularly, method 1100 is directed at generating a counterexample to a selected invariant. Method 1100 may be executed during a DFS traversal of the concrete model using execution traces generated by method 1000 to guide the traversal of a concrete model of the system. The steps of method 1100 are not all-inclusive, and may include other steps not shown for the sake of brevity.

In step 1102, a determination is made regarding whether a state of one of the execution traces satisfies the selected invariant. If the state satisfies the selected invariant, then operation of method 1100 is complete. Method 1100 may be performed subsequently on another selected state and/or selected invariant of the state. Otherwise, if the state does not satisfy the selected invariant, then processing continues in step 1104. In step 1104, the state is provided as a counterexample to the selected invariant. Providing the counterexample may include displaying the counterexample on a screen or other suitable display device, printing the counterexample on a printer or other suitable printing device, storing the counterexample for later retrieval or providing the counterexample to another application, circuit or device.

Figure 12:
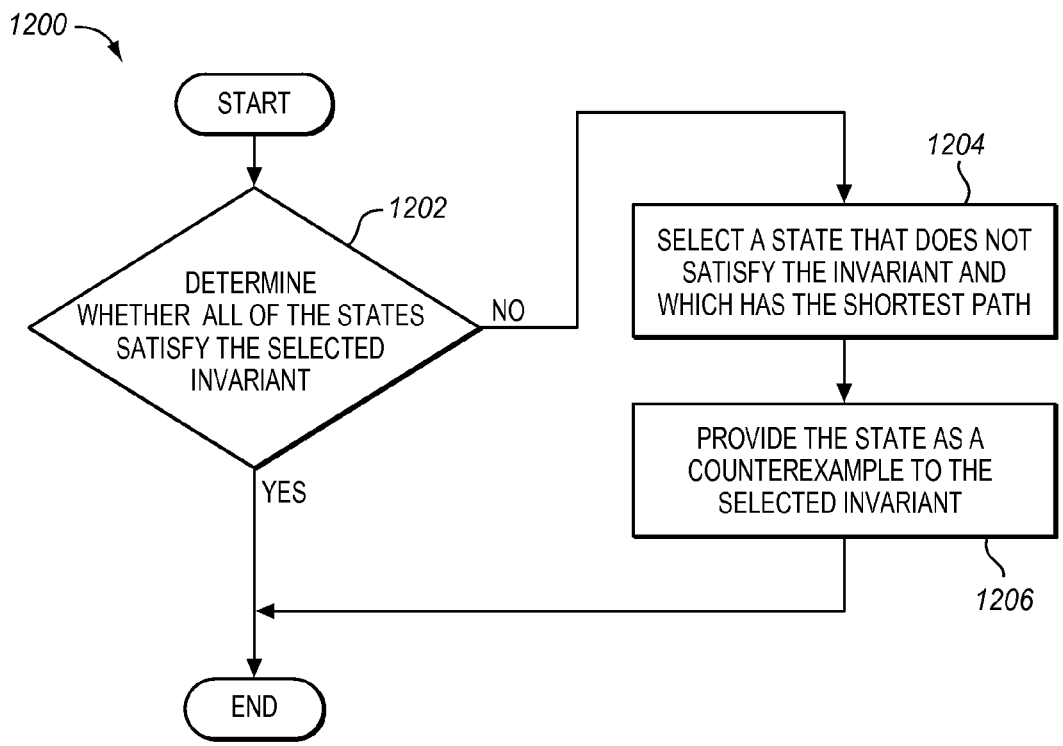
FIG. 12 illustrates a method for performing invariant checking of a system in another exemplary embodiment of the invention.

While method 1000 does not guarantee initially finding the shortest length counterexample to bad states, the shortest length counterexample may be determined by replaying all execution traces on the concrete model and then determining which counterexample has the shortest path. FIG. 12 illustrates a method 1200 for performing invariant checking of a system in another exemplary embodiment of the invention. Particularly, method 1200 is directed at determining the shortest length counterexample to a selected invariant of a system. Method 1200 may be executed during a DFS traversal of a concrete model of a system using the execution traces generated by method 1000 to guide the traversal of the concrete model of the system. The steps of method 1200 are not all-inclusive, and may include other steps not shown for the sake of brevity.

In step 1202, a determination is made regarding whether all of the states satisfy the selected invariant of the system. If all of the states satisfy the selected invariant, then no counterexample is found, and operation of method 1200 is complete. Otherwise, processing continues in step 1204. In step 1204, a selection is made of a state that does not satisfy the selected invariant and which has the shortest path from the initial states. The states may be sorted by the length of their paths from the initial states, with the shortest length path selected as the counterexample. In step 1206, the state is provided to a user or another application or device as a counterexample to the selected invariant. The provided counterexample may then be used for correcting the logic of the program to operate correctly.

Although specific embodiments were described herein, the scope of the invention is not limited to those specific embodiments. The scope of the invention is defined by the following claims and any equivalents therein.

I claim:

1. A method for performing invariant checking of a system, the method comprising:
   generating, by a computational device, an abstract control model of the system from a concrete model of the system based on control paths and predicates, the abstract control model of the system including control flow information regarding the system, wherein the concrete model is an original representation of the system, and wherein the abstract control model allows for a simulation of the system to prove or disprove one more selected invariants;

determining, whether a selected invariant includes only control variables of the system;

in response to determining that the selected invariant includes only the control variables of the system, performing a depth-first search of the abstract control model to determine satisfiablity of the selected invariant; and in response to determining that the selected invariant does not include only the control variable of the system, performing:

generating, by the computational device, execution traces of the system using the control flow information of the abstract control model;

providing, by the computational device, the execution traces for use as constraints on the concrete model during a depth-first search of the concrete model to determine whether the selected invariant of the system is satisfiable, wherein the execution traces are based on a likelihood of an execution trace to lead to a disproving of the selected invariant based on a cone of influence of variables referred to in the selected invariant;

a variable is within the cone of influence of another variable if the variable depends on the other variable; and in a control flow graph corresponding to the concrete model of the system those control flow graph paths that include a defined variable within the cone of influence of a variable referred to in the selected invariant are more likely to lead to a contradiction of the selected invariant in comparison to those control flow graph paths that do not include the defined variable within the cone of influence of the variable referred to in the selected invariant.

2. The method of claim 1 wherein sorting the execution traces based on the invariant cone of influence further comprises:

determining first variables referred to in the selected invariant;

retrieving second variables in a cone of influence of the first variables referred to in the selected invariant;

determining whether the second variables in the cone of influence of the first variables are included in a set of define variables of each execution trace; and sorting the execution traces based on execution traces including the second variables in a set of define variables of each execution trace.

3. The method of claim 1 further comprising:

traversing at least one of the execution traces on the concrete model of the system using the depth-first search to determine whether the selected invariant is satisfiable to generate a result indicating whether the selected invariant is satisfiable; and providing the result.

4. The method of claim 1 wherein generating the abstract control model of the system further comprises:

generating a control flow graph (CFG) of the system;

generating a set of control paths and predicates based on the CFG; and generating the abstract control model based on the control paths and predicates.

5. The method of claim 4 wherein generating the CFG further comprises:

replacing each decision node predicate expression of the system in the CFG with a Boolean variable comparison expression; and creating a binary decision diagram (BDD) of each Boolean variable expression of the CFG.

6. The method of claim 4 wherein generating the set of control paths and predicates further comprises:

performing a depth-first search of the CFG to generate the set of control paths and predicates.

\* \* \* \* \*